United States Patent
Umeno et al.

(10) Patent No.: US 7,288,791 B2
(45) Date of Patent: Oct. 30, 2007

(54) EPITAXIAL WAFER AND METHOD FOR MANUFACTURING METHOD

(75) Inventors: Shigeru Umeno, Tokyo (JP); Satoshi Murakami, Tokyo (JP); Hirotaka Fujii, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 18 days.

(21) Appl. No.: 10/488,335

(22) PCT Filed: Aug. 15, 2003

(86) PCT No.: PCT/JP03/10390

§ 371 (c)(1), (2), (4) Date: Feb. 27, 2004

(87) PCT Pub. No.: WO2004/020705

PCT Pub. Date: Mar. 11, 2004

(65) Prior Publication Data

US 2005/0035349 A1    Feb. 17, 2005

(30) Foreign Application Priority Data

Aug. 30, 2002    (JP) .............................. 2002-252463

(51) Int. Cl.
*H01L 29/04* (2006.01)
(52) U.S. Cl. .................. 257/64; 257/609; 438/481
(58) Field of Classification Search ................. 257/609, 257/64; 438/481
See application file for complete search history.

(56) References Cited

U.S. PATENT DOCUMENTS

| 4,987,472 | A | * | 1/1991 | Endo et al. | ................. 148/33.4 |
| 6,630,024 | B2 | * | 10/2003 | Schmolke et al. | .......... 117/106 |
| 6,743,495 | B2 | * | 6/2004 | Vasat et al. | ................. 428/64.1 |

FOREIGN PATENT DOCUMENTS

| JP | 62-226891 A1 | 10/1987 |
| JP | 2000-100737 A1 | 4/2000 |

OTHER PUBLICATIONS

Patent Abstracts of Japan for JP62-226891 published on Oct. 5, 1987.
Patent Abstracts of Japan for JP2000-100737 published on Apr. 7, 2000.

* cited by examiner

*Primary Examiner*—Douglas M. Menz
(74) *Attorney, Agent, or Firm*—Darby & Darby

(57) ABSTRACT

It is an object of the present invention to provide an epitaxial wafer with fewer pit defects in the epitaxial layer of a silicon monocrystalline wafer that has been doped with arsenic. Pit defects tend to occur when gas etching is performed prior to epitaxial film formation, but this tendency is reversed and a sound epitaxial layer is obtained by setting the crystal plane orientation to (100) and specifying the range of the tilt angle for the angle θ in the [001] direction or [00$\bar{1}$] direction or the angle φ in the [0$\bar{1}$0] direction or [010] direction with respect to the [100] axis.

7 Claims, 1 Drawing Sheet

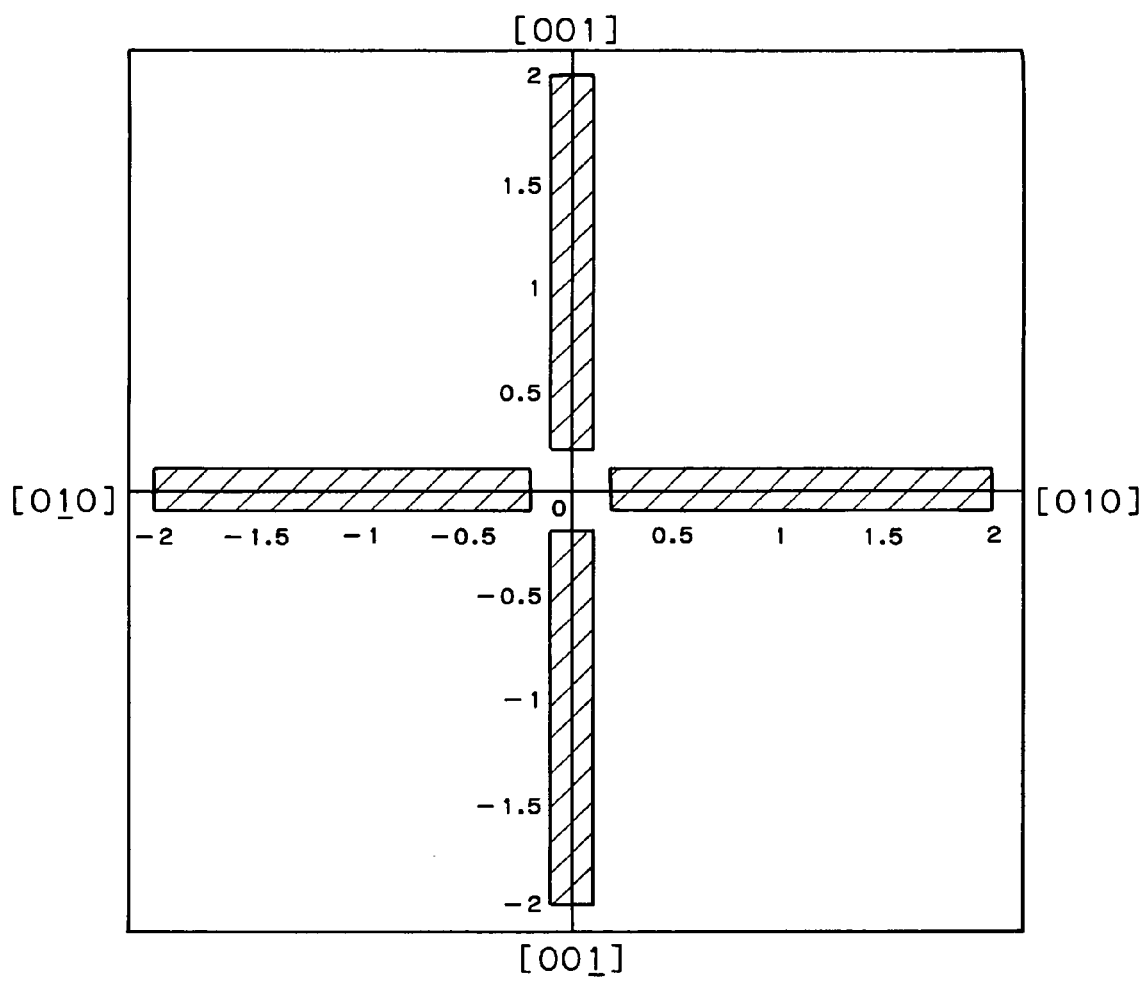

EPITAXIAL WAFER AND METHOD FOR MANUFACTURING METHOD

CROSS-REFERENCE TO PRIOR APPLICATION

This is a U.S. national phase application under 35 U.S.C. § 371 of International Patent Application No. PCT/JP03/10390 filed Aug. 15, 2003, and claims the benefit of Japanese Patent Application No. 2002-252463 filed Aug. 30, 2002, which is incorporated by reference herein.

TECHNICAL FIELD

This invention relates to an epitaxial wafer with fewer pit defects in the epitaxial layer, and more particularly relates to the above-mentioned epitaxial wafer in which the number of pit defects has been reduced by using a wafer produced by slicing an ingot in a specific planar orientation, for a silicon monocrystalline wafer that has been doped with arsenic (As) and is prone to pitting when subjected to gas etching prior to epitaxial film formation, and to a method for manufacturing this epitaxial wafer.

BACKGROUND ART

In the past, the off-angle (that is, the tilt angle) of a (100) plane substrate in the manufacture of silicon epitaxial wafers has been specified in SEMI (Semiconductor Equipment and Materials International) standards to be no more than 2° (SEMI M2-87).

More recently, substrates with a tilt angle of 1° or less have come into mainstream use through increases in substrate machining precision.

For example, Japanese Patent Publication H3-61634 discloses a technique aimed at reducing microscopic defects (teardrops) during epitaxial growth, in which the angle θ in the [011] direction or [01$\underline{1}$] direction or the angle θ in the [01$\underline{1}$] direction or [0$\underline{1}$1] direction with respect to the [100] axis was $5' \leq \theta \leq 2°$ and $\phi \leq 10'$, or $5' \leq \phi \leq 2°$ and $\theta \leq 10'$.

The underlines of the numbers indicating direction refer to the lines that ordinarily go over the numbers in crystallographic notation, but underlines will be used herein for the sake of convenience.

However, when a silicon (100) substrate wafer was epitaxially grown within these numerical ranges, the epitaxial wafer surface was sometimes rougher than the substrate wafer surface, which made it difficult to control the micro-roughness of the epitaxial wafer surface.

In view of this, Japanese Patent 3,081,706 discloses a method for improving the above-mentioned micro-roughness, in which the above-mentioned angle ranges for the slicing orientation are specified to be $30' \leq \theta \leq 2°$ and $30' \leq \phi \leq 2°$.

DISCLOSURE OF THE INVENTION

The inventors discovered that the problem of pitting of the film layer after epitaxial growth is encountered when, in the manufacture of an epitaxial wafer, the surface of a standard silicon monocrystalline wafer that is n-type and has a low resistance of about 3 to 5 mΩ·cm is subjected to mirror polishing through a standard manufacturing procedure and further subjected to HCl gas etching prior to epitaxial growth for the sake of cleaning.

It is an object of the present invention to provide an epitaxial wafer with fewer pit defects in the epitaxial layer.

More particularly, it is an object of the present invention to provide an epitaxial wafer in which the above-mentioned pitting in a silicon monocrystalline wafer that has been doped with arsenic (As), which is prone to pitting when subjected to gas etching prior to epitaxial film formation, is suppressed when epitaxial film formation is performed, and a sound epitaxial layer is obtained, and to a method for manufacturing this epitaxial wafer.

As a result of diligent research into the tilt of the crystal axis and the planar orientation of a wafer in an effort to reduce the pitting of an epitaxial layer, the inventors perfected the present invention upon discovering that a sound epitaxial layer can be obtained by specifying a tilt angle of orientation that is different from the tilt angle specified in order to improve micro-roughness or tear-drop formation in the past as discussed above.

Specifically, the epitaxial wafer of the present invention is a wafer in which an epitaxial layer is grown on a wafer sliced from a silicon monocrystalline ingot that is doped with arsenic and has a resistivity of at least 2.5 mΩ·cm, wherein the planar orientation thereof is (100) and the slice is at an angle θ in the [001] direction or [00$\underline{1}$] direction and an angle φ in the [010] direction or [0$\underline{1}$0] direction with respect to the [100] axis ($0.2° \leq \theta$ and $\phi \leq 0.1°$, or $0.2° \leq \phi$ and $\theta \leq 0.1°$).

Also, the epitaxial wafer pertaining to the present invention is characterized in that an epitaxial film is formed on a wafer surface that has undergone gas etching for the sake of cleaning prior to epitaxial film formation, which reduces the number of pits seen after epitaxial film formation.

The method for manufacturing an epitaxial wafer pertaining to the present invention comprises the steps of:

slicing a silicon monocrystalline ingot such that the wafer has a crystal plane orientation of (100) and angles θ and φ are within specific ranges ($0.2° \leq \theta$ and $\phi \leq 0.1°$, or $0.2° \leq \phi$ and $\theta \leq 0.1°$);

gas etching the wafer surface prior to epitaxial film formation; and epitaxially forming a film on the wafer surface, wherein there is a reduction in the number of pits seen after epitaxial film formation.

With the present invention, as will be shown in the examples, an epitaxial wafer with a reduction in the number of pit defects in the epitaxial layer can be provided with no special step or additional work involved in the cutting of the silicon monocrystalline ingot, merely by specifying the orientation tilt angle during cutting.

In particular, with the present invention, the above-mentioned pitting is suppressed, and a sound epitaxial layer is obtained, even when epitaxial film formation is performed on a silicon monocrystalline wafer that has been doped with arsenic (As), which is prone to pitting when subjected to gas etching prior to epitaxial film formation.

BRIEF DESCRIPTION OF THE DRAWINGS

FIG. 1 is a graph of the tilt range within which the epitaxial wafer pertaining to the present invention is sliced from the silicon monocrystalline ingot. The vertical axis is the tilt angle in the [001] direction or [00$\underline{1}$] direction from the [100] axis, and the horizontal axis is the tilt angle in the [010] direction or [0$\underline{1}$0] direction from the [100] axis. The rectangular portions on the vertical and horizontal axes are within the range of tilt angle of the present invention.

BEST MODE FOR CARRYING OUT THE INVENTION

In the present invention, because the silicon monocrystalline ingot and wafer are used in the manufacture of an epitaxial wafer, they must be doped with arsenic and have a resistivity of at least 2.5 mΩ·cm. There is no need to place an upper limit on resistivity here.

In the present invention, the crystal plane orientation of the wafer is (100), in the (100) plane of the wafer the crystal directions [001], [00$\bar{1}$], [0$\bar{1}$0], and [010] pass through the wafer center, and the angular component in the [001] direction or [00$\bar{1}$] direction with respect to the [100] axis is termed the angle q, while the angular component in the [0$\bar{1}$0] direction or [010] direction is termed the angle f, both of which are angles formed by the (100) plane normal and the planar normal of the wafer surface.

As shown in FIG. 1, the present invention is characterized in that the above-mentioned tilt angles θ and φ are kept within ranges of $0.2° \leq θ$ and $φ \leq 0.1°$, or $0.2° \leq φ$ and $θ \leq 0.1°$. If θ is 0.2° or greater, it should be greater than f, and the difference is preferably at least 0.1. Similarly, if φ is 0.2° or greater, it should be greater than q.

The inventors have surmised that pit defects in the epitaxial layer are caused by COP, and whether or not these pit defects are generated (remain) depends on the above-mentioned tilt angle. The inventors have also confirmed that if the tilt angles θ and φ are kept within the ranges given above, no pit defects will occur on the surface after epitaxial film formation.

In the present invention, the step of slicing wafers from the silicon monocrystalline ingot can be accomplished by any known slicing method that makes use of a wire saw, ID blade, etc.

The manufacturing steps after slicing the ingot into wafers can include any known steps and methods according to the intended use and the required properties, cleanliness, and so forth, such as various kinds of grinding steps, mirror polishing steps, chamfering steps, washing steps, and so forth. The types of steps selected, the order in which they are carried out, and so forth can be determined as appropriate.

In the present invention, there are no particular restrictions on the step of epitaxially forming a film on the wafer surface, and any known vapor phase film formation method and vapor phase growth apparatus can be used if they allow for the vapor phase growth of a silicon epitaxial layer required as a substrate in the manufacture of semiconductor devices. The source gas and film formation conditions should be determined according to the selected method and apparatus, etc. The treatment temperature should be between 1050 and 1150° C.

Also employed in the present invention is a step of gas etching the wafer surface before it undergoes epitaxial film formation. In specific terms, as will be shown in the examples, the preliminary steps to epitaxial film formation are carried out, namely, hydrogen gas replacement while the temperature is raised inside a chamber, and hydrogen baking at the required temperature, this is followed by HCl gas etching, after which a source gas is introduced at the temperature and in the atmosphere required for film formation, and vapor phase growth is performed so as to obtain the required film thickness, thereby forming a silicon epitaxial layer.

As for the hydrogen baking conditions, a temperature of 1050° C. to 1200° C. is preferable, and a chlorine compound gas can be used instead of HCl gas. The preferred amount of etching is to a depth of no more than 0.5 μm from the surface.

EXAMPLES

Example 1

Using a wire saw apparatus (made by Nippei Toyama), silicon monocrystalline wafers were produced from a silicon monocrystalline ingot that had been doped with arsenic, had an outside diameter of 6 inches, and had been pulled up by the Czochralski method. The resulting wafers had a resistivity of 4 mΩ·cm, were n-type, and the tilt angles from the (100) plane were θ=0.24° and φ=0.02°.

These wafers were mirror polished and washed, after which they were subjected to hydrogen baking in which they were held for 1 minute in a 1150° C. hydrogen atmosphere, and then HCl gas was introduced to perform gas etching to a depth of about 0.1 μm. A source gas was then supplied and vapor phase growth was performed while the temperature was held at 1100° C., which formed an epitaxial layer with a thickness of 4 μm.

In the above steps, the condition of the wafer surface was observed by light scattering method (A) prior to placing the wafer in the vapor phase growth apparatus, (B) after gas etching, and (C) after epitaxial film formation, and the number of defects was examined. These results are given in Table 1.

An M0601 made by Mitsui Mining & Smelting was used to count the defects (COP) prior to placing the wafer in the vapor phase growth apparatus (A). A Surfscan 6220 made by KLA Tencor was used to count the defects (pits) after gas etching (B) and after epitaxial film formation (C).

Regarding the defect counts in Table 1, the COP count prior to placing the wafer in the vapor phase growth apparatus (A) was 26, 035, the number of pits after gas etching (B) was 2621, and the number of pits after epitaxial film formation (C) was 22.

Example 2

Using a wire saw apparatus, silicon monocrystalline wafers were produced from a silicon monocrystalline ingot that had been doped with arsenic, had an outside diameter of 6 inches, and had been pulled up by the Czochralski method. The resulting wafers had a resistivity of 4.8 mΩ·cm, were n-type, and the tilt angles from the (100) plane were θ=0.20° and φ=0.10°.

An epitaxial layer with a thickness of 4 μm was formed under the same conditions as in Example 1, using the wafer obtained above. The product was observed and measured under the same conditions as in Example 1. Specifically, Table 1 shows the defect counts prior to placing the wafer in the vapor phase growth apparatus (A), after gas etching (B), and after epitaxial film formation (C).

Regarding the defect counts in Table 1, the COP count prior to placing the wafer in the vapor phase growth apparatus (A) was 25, 303, the number of pits after gas etching (B) was 2754, and the number of pits after epitaxial film formation (C) was 34.

COMPARATIVE EXAMPLE 1

Using a wire saw apparatus, silicon monocrystalline wafers were produced from a silicon monocrystalline ingot that had been doped with arsenic, had an outside diameter of 6 inches, and had been pulled up by the Czochralski method. The resulting wafers had a resistivity of 4.2 mΩ·cm, were n-type, and the tilt angles from the (100) plane were θ=0.18° and φ=0.13°.

An epitaxial layer with a thickness of 4 µm was formed under the same conditions as in Example 1, using the wafer obtained above. The product was observed and measured under the same conditions as in Example 1. Specifically, Table 1 shows the defect counts prior to placing the wafer in the vapor phase growth apparatus (A), after gas etching (B), and after epitaxial film formation (C).

Regarding the defect counts in Table 1, the COP count prior to placing the wafer in the vapor phase growth apparatus (A) was 28, 902, the number of pits after gas etching (B) was 15, 253, and the number of pits after epitaxial film formation (C) was 7546.

COMPARATIVE EXAMPLE 2

Using a wire saw apparatus, silicon monocrystalline wafers were produced from a silicon monocrystalline ingot that had been doped with arsenic, had an outside diameter of 6 inches, and had been pulled up by the Czochralski method. The resulting wafers had a resistivity of 3.6 mΩ·cm, were n-type, and the tilt angles from the (100) plane were θ=0.22° and φ=0.21°.

An epitaxial layer with a thickness of 4 µm was formed under the same conditions as in Example 1, using the wafer obtained above. The product was observed and measured under the same conditions as in Example 1. Specifically, Table 1 shows the defect counts prior to placing the wafer in the vapor phase growth apparatus (A), after gas etching (B), and after epitaxial film formation (C).

Regarding the defect counts in Table 1, the COP count prior to placing the wafer in the vapor phase growth apparatus (A) was 2822, the number of pits after gas etching (B) was 2125, and the number of pits after epitaxial film formation (C) was 252.

A comparison of the examples and comparative examples above reveals that the number of defects after formation of the epitaxial layer can be reduced with the present invention even when the COP count of the substrate is high.

TABLE 1

| | Detect count prior to placing the wafer in the vapor phase growth apparatus (A) | Defect count after gas etching (B) | Defect count after epitaxial film formation (C) |
|---|---|---|---|
| Example 1 | 26035 | 2621 | 22 |
| Example 2 | 25303 | 2754 | 34 |
| Comparative Example 1 | 28902 | 15253 | 7546 |
| Comparative Example 2 | 2822 | 2125 | 252 |

INDUSTRIAL APPLICABILITY

With the present invention, an epitaxial wafer with a reduction in the number of pit defects in the epitaxial layer can be provided with no special step or additional work involved, merely by cutting a silicon single crystal at a specific orientation and tilt angle in the manufacture of an epitaxial wafer. This greatly improves the manufacturing process.

Also, with the present invention, gas etching, which improves cleaning, can be performed prior to epitaxial film formation on a silicon monocrystalline wafer that has been doped with arsenic (As), the occurrence of pit defects after epitaxial film formation can be suppressed, and a sound epitaxial layer can be obtained.

The invention claimed is:

1. An epitaxial wafer comprising:
    an epitaxial silicon layer on a surface of a wafer, wherein the wafer has a crystal plane orientation of (100) and is sliced from a silicon monocrystalline ingot that is doped with arsenic and has a resistivity of at least 2.5 mΩ·cm, and the slice is made at an angle θ in the [001] direction or [00$\bar{1}$] direction and an angle φ in the [010] direction or [0$\bar{1}$0] direction with respect to the [100] axis, where $0.24° \leq \theta$ and $\phi \leq 0.1°$, or $0.24° \leq \phi$ and $\theta \leq 0.1°$, and wherein a pit density in the epitaxial silicon layer is less than 1 defect/in$^2$.

2. The epitaxial wafer according to claim 1, wherein the epitaxial silicon layer is a product of epitaxial film formation on a wafer surface that has undergone gas etching prior to the epitaxial film formation.

3. A method for manufacturing an epitaxial wafer, comprising:
    slicing a silicon monocrystalline ingot such that a wafer has a crystal plane orientation of (100) and, when θ is the angle in the [001] direction or [00$\bar{1}$] direction and φ is the angle in the [010] direction or [0$\bar{1}$0] direction with respect to the [100] axis, the slice is made such that $0.24° \leq \theta$ and $\phi \leq 0.1°$, or $0.24° \leq \phi$ and $\theta \leq 0.1°$;
    gas etching a surface of the wafer; and
    epitaxially forming a film on the surface of the wafer, wherein a pit density in the epitaxial film is less than 1 defect/in$^2$.

4. The method for manufacturing an epitaxial wafer according to claim 3, further comprising:
    doping the silicon monocrystalline ingot with arsenic, the resultant silicon monocrystalline ingot having a resistivity of at least 2.5 mΩ·cm.

5. The method for manufacturing an epitaxial wafer according to claim 3, wherein the gas etching is performed with HCl gas.

6. The method for manufacturing an epitaxial wafer according to claim 3, wherein the gas etching is performed to a depth of no more than 5 µm from the surface of the wafer.

7. The method for manufacturing an epitaxial wafer according to claim 3, wherein the film forming is performed at a temperature of between 1050° C. and 1150° C.

* * * * *